(12) United States Patent
Nicolai et al.

(10) Patent No.: US 7,637,118 B2
(45) Date of Patent: Dec. 29, 2009

(54) COOLING DEVICE FOR A SWITCHGEAR CABINET

(75) Inventors: Michael Nicolai, Rabenau (DE); Martin Dörrich, Sinn (DE)

(73) Assignee: Rittal GmbH & Co. KG, Herborn (DE)

( * ) Notice: Subject to any disclaimer, the term of this patent is extended or adjusted under 35 U.S.C. 154(b) by 582 days.

(21) Appl. No.: 11/082,232

(22) Filed: Mar. 16, 2005

(65) Prior Publication Data

US 2005/0217302 A1    Oct. 6, 2005

(30) Foreign Application Priority Data

Mar. 16, 2004    (DE)    .................. 10 2004 012 978

(51) Int. Cl.
*F25D 23/12*    (2006.01)
*F25D 21/14*    (2006.01)

(52) U.S. Cl. .................. 62/259.2; 62/285

(58) Field of Classification Search ........... 62/259.2, 62/183, 309, 272, 285, 288, 291; 165/10, 165/47, 95
See application file for complete search history.

(56) References Cited

U.S. PATENT DOCUMENTS

| | | | | |
|---|---|---|---|---|
| 2,747,381 A * | 5/1956 | Lazar | ............ | 62/336 |
| 2,957,067 A * | 10/1960 | Scofield | ............ | 219/400 |
| 2,993,349 A * | 7/1961 | Detwiler | ............ | 62/256 |
| 3,359,751 A * | 12/1967 | Stevens | ............ | 62/186 |
| 3,365,118 A * | 1/1968 | Winfield, Jr. | ............ | 415/211.2 |
| 3,379,029 A * | 4/1968 | King | ............ | 62/180 |
| 3,627,032 A * | 12/1971 | Glad et al. | ............ | 165/95 |
| 3,812,687 A * | 5/1974 | Stolz | ............ | 62/323.1 |
| 3,822,561 A * | 7/1974 | Miller | ............ | 62/157 |
| 3,938,352 A * | 2/1976 | Schmidt | ............ | 62/279 |
| 4,660,390 A * | 4/1987 | Worthington | ............ | 62/309 |
| 4,934,451 A * | 6/1990 | Colvin | ............ | 165/48.1 |
| 5,056,588 A * | 10/1991 | Carr | ............ | 165/10 |
| 5,074,119 A * | 12/1991 | Anderson | ............ | 62/150 |
| 5,157,935 A * | 10/1992 | Gregory | ............ | 62/278 |
| 5,345,779 A * | 9/1994 | Feeney | ............ | 62/259.2 |
| 5,682,757 A * | 11/1997 | Peterson | ............ | 62/259.2 |
| 5,819,552 A * | 10/1998 | Lee | ............ | 62/407 |
| 6,015,634 A * | 1/2000 | Bonville et al. | ............ | 429/17 |
| 6,257,007 B1 * | 7/2001 | Hartman | ............ | 62/183 |
| 6,394,174 B1 * | 5/2002 | Hsieh | ............ | 165/47 |
| 6,579,063 B2 * | 6/2003 | Stairs et al. | ............ | 416/169 A |
| 6,651,452 B2 * | 11/2003 | Lecke et al. | ............ | 62/230 |
| 7,104,081 B2 * | 9/2006 | Chu et al. | ............ | 62/259.2 |
| 7,118,333 B2 * | 10/2006 | Takemoto | ............ | 415/211.2 |
| 7,266,970 B2 * | 9/2007 | Li | ............ | 62/310 |
| 2003/0129465 A1 * | 7/2003 | Nakamura et al. | ............ | 429/26 |

FOREIGN PATENT DOCUMENTS

DE    3918721 A1 * 12/1990

OTHER PUBLICATIONS

English translation DE 39 18721.*

* cited by examiner

*Primary Examiner*—William C Doerrler
(74) *Attorney, Agent, or Firm*—Pauley Petersen & Erickson

(57) ABSTRACT

A cooling device for a switchgear cabinet having an air-conducting conduit in which an air/water heat exchanger is arranged, and through which cooling air flows and to which a condensate collection container for collecting accumulating condensate. A pump installation conveys the condensate out of the condensate collection container.

19 Claims, 3 Drawing Sheets

COOLING DEVICE FOR A SWITCHGEAR CABINET

BACKGROUND OF THE INVENTION

1. Field of the Invention

This invention relates to a cooling device for a switchgear cabinet, having an air-conducting conduit in which an air/water heat exchanger is arranged through which cooling air flows, and to which a condensate collection container for collecting accumulating condensate is assigned.

2. Discussion of Related Art

Known cooling devices are employed, for example, in switchgear cabinets in which electronic components are housed, which yield considerable dissipated energy in the form of heat. Air/water heat exchangers, which absorb the heat inside the switchgear cabinet and transfer it to cooling water, which must be removed from the switchgear cabinet, are employed for removing this heat from the switchgear cabinet. The heat-containing cooling water is conveyed via a cooling water return line and is cooled in an external cooling device, which also has an air/water heat exchanger, by releasing the heat into the ambient air. Subsequently, the cooled cooling water is conducted via a cooling water feed line back to the air/water heat exchanger in the switchgear cabinet to again absorb heat.

Because of the humidity prevailing in the switchgear cabinet, condensate is formed on the air/water heat exchanger in the switchgear cabinet, drips off and is caught in a condensate collection container. The condensate is conveyed out of the switchgear cabinet through a run-off hose. There, the liquid drips on the ground or is caught in an external container. The collection container must be emptied at certain intervals, which increases maintenance costs.

It is also known to let the accumulating condensate evaporate into the environment by condensate evaporation. Because such condensate evaporators are only allowed to have a low structural height because of the limited structural space, their evaporation output is low. With a large amount of condensate generated, the condensate escapes via a provided safety outlet and drips on the ground again.

With computer applications in information technology, the above described condensate removal is undesirable.

SUMMARY OF THE INVENTION

It is one object of this invention to provide a cooling device for a switchgear cabinet which allows the effective removal of generated condensate not only from the switchgear cabinet itself, but also from the surroundings of the switchgear cabinet.

This object of the invention is achieved with a cooling device having characteristics described in this specification and in the claims.

A provided pump installation can move the collecting condensate out of the condensate collection container. The uncontrolled dripping of condensate to the ground is thus prevented. Instead, the liquid condensate can be removed over controlled paths.

The air/water heat exchanger is connected with an external cooling device via a cooling water feed line for the supply with cooled cooling water, and via a cooling water return line for returning warmed cooling water. The pump installation is connected with the cooling water return line, so that the condensate can be pumped out of the condensate collection container into the cooling water return line.

For determining the condensate level in the condensate collection container, a sensor device can be arranged in the condensate collection container. This can be connected with the pump installation so that the pump installation only pumps condensate when a predetermined level of condensate is reached.

In accordance with one embodiment of this invention, the air/water heat exchanger forms a closed cooling system together with the external cooling device, to which collecting condensate is fed.

The pump installation can include a submersible pump lowered into the condensate in the condensate collection container, but can also be arranged outside of the condensate collection container and can be connected with it via a condensate connecting line. Thus, the pump installation can be arranged underneath the condensate collection container, and the condensate collection container can include an outlet opening at its bottom, to which the condensate connecting line is connected.

BRIEF DESCRIPTION OF THE DRAWINGS

This invention is described in greater detail in view of two embodiments and by referring to the drawings, wherein.

DESCRIPTION OF PREFERRED EMBODIMENTS

Figure 1:
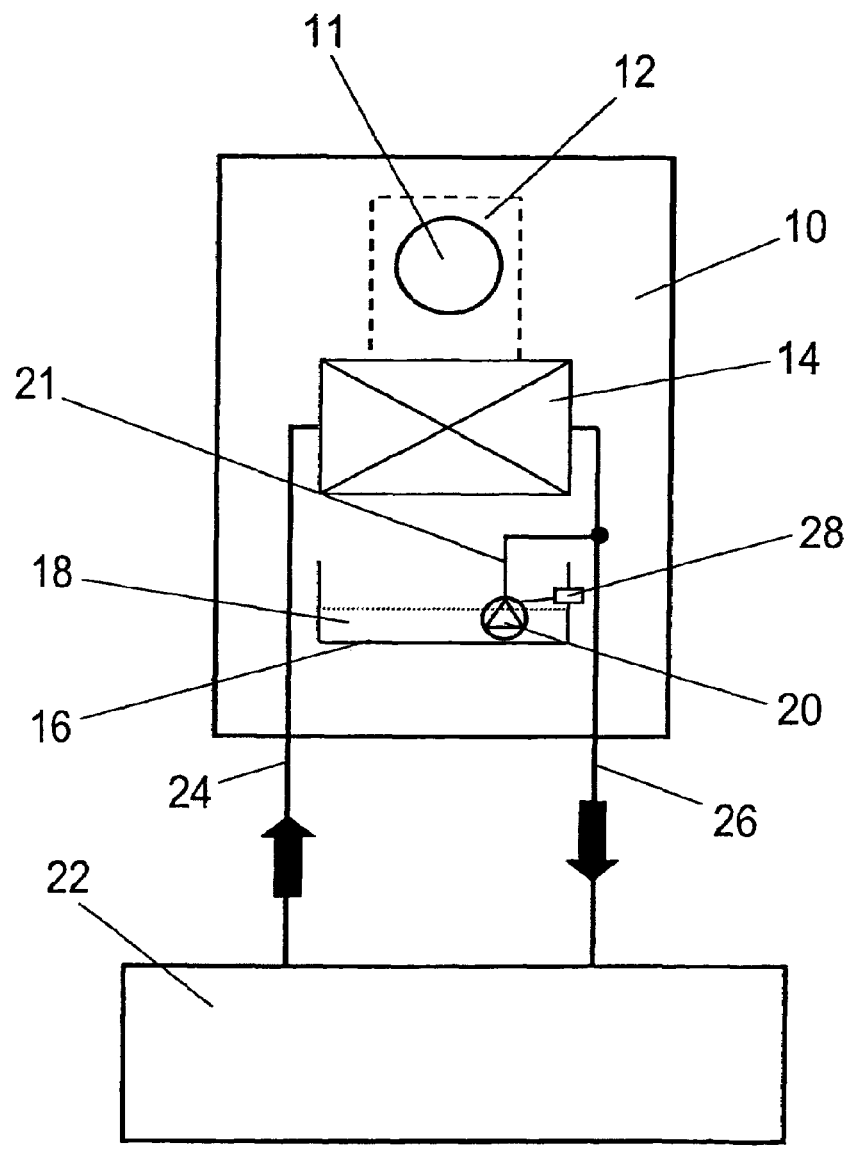
FIG. 1 is a schematic lateral view of a cooling device with a pump installation arranged inside of the condensate collection container.

A cooling device for a switchgear cabinet 10 is shown in a schematic lateral view in FIG. 1. The switchgear cabinet 10 has a fan 11, which conveys cooling air inside of an air-conducting conduit 12. An air/water heat exchanger 14 is arranged in the air-conducting conduit 12. A condensate collection container 16 is arranged underneath the air/water heat exchanger 14 for catching accumulating dripping off condensate 18.

The air/water heat exchanger 14 is connected with an external cooling device 22 via a cooling water feed line 24 for the supply with cooled cooling water. The air/water heat exchanger 14 is connected via a cooling water return line 26 for returning warmed cooling water from the air/water heat exchanger 14. An electrically operated pump installation 20 with a submersible pump is arranged inside the condensate collection container 16. The pump arrangement 20 is used for removing condensate 18 from the condensate collection container 16.

The pump installation 20 is connected with the cooling water return line 26 via a line 21 and pumps the condensate 18 out of the condensate collection container 16 into the cooling water return line 26.

An electronic sensor 28 is arranged at the condensate collection container 16, by which the condensate level in the condensate collection container 16 can be determined. The sensor device 28 is connected via an electrical conductor with the pump installation 20. The pump installation 20 is wired so that it conveys condensate 18 only when a predetermined condensate level is reached and pumps it into the condensate return line 26.

Together with the external cooling device 22, the air/water heat exchanger 14 forms a closed system, into which accumulating condensate 18 is pumped.

Figure 2:
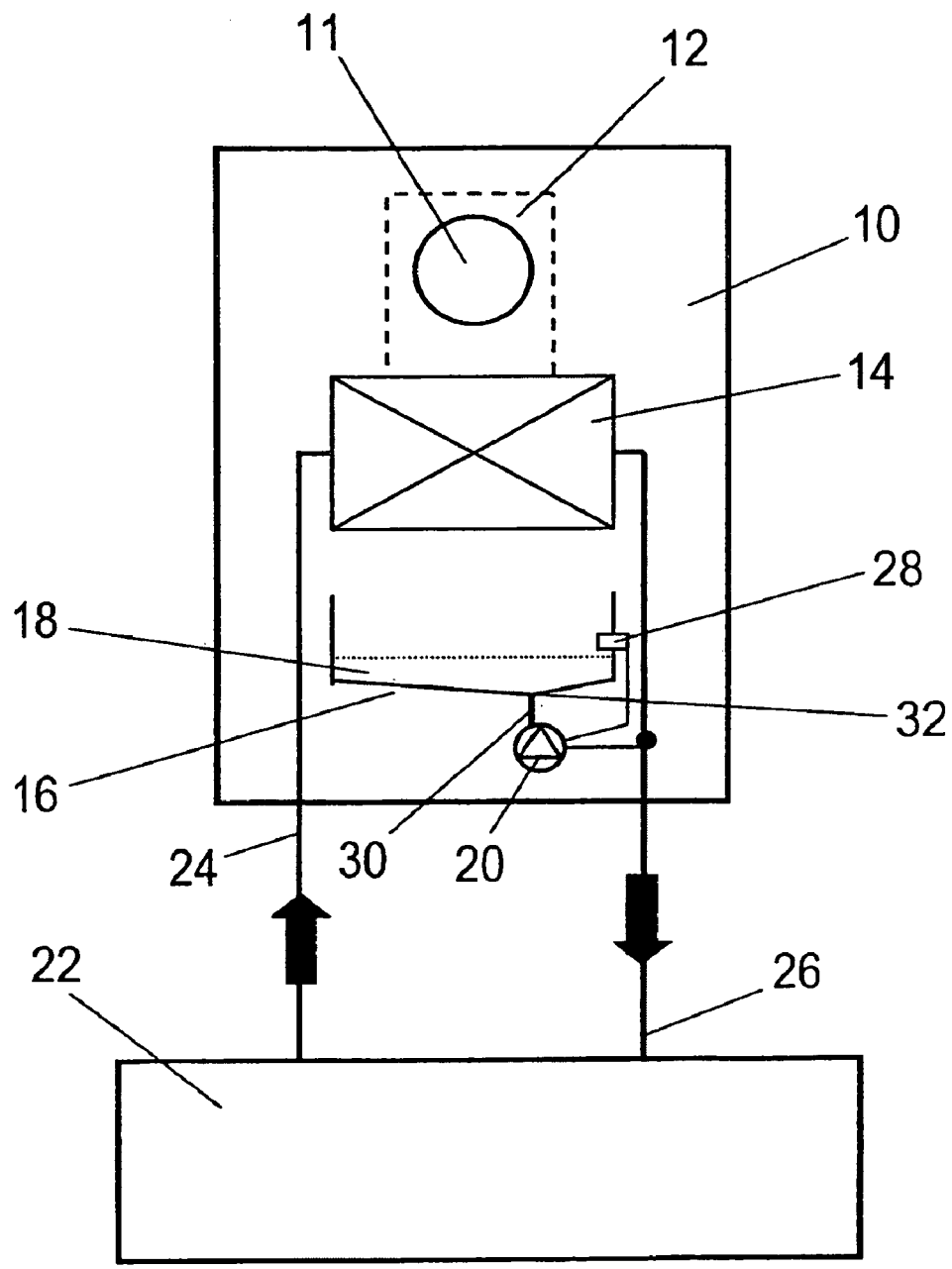
FIG. 2 is a schematic lateral view of a cooling device with a pump installation arranged underneath the condensate collection container.
Figure 3:
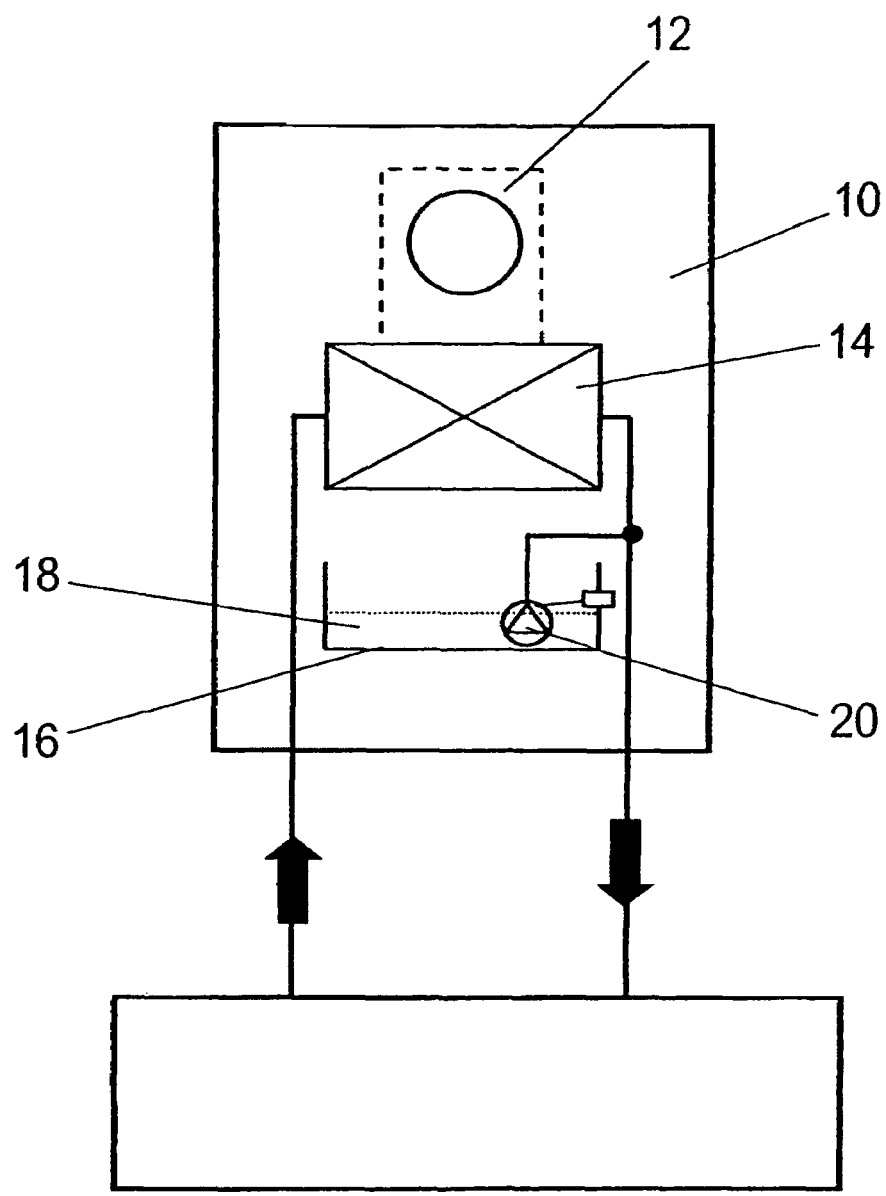
FIG. 3 is a schematic lateral view of a general arrangement of a cooling device with a pump installation.

In a schematic lateral view, FIG. 2 shows a further cooling device for a switchgear cabinet 10 with a pump installation arranged underneath the condensate collection container 16.

In the embodiment shown in FIG. 2, the same reference numerals are used for the same components as in the embodiment described in view of FIG. 1, so that only the differences between the embodiment in accordance with FIG. 2 and the embodiment already described in view of FIG. 1 is explained.

The pump installation 20 is arranged underneath the condensate collection container 16 and is connected with it via a line 30 carrying condensate. For letting the condensate enter the line 30 in a simple manner, the area of the bottom of the condensate collection container 16 is shaped in the form of a funnel in the direction toward an outlet opening 32 in the bottom, to which the condensate carrying line 30 is connected. Thus, in cooperation with the sensor device 28, condensate is present at the pump installation 20, and the pump installation does not pump air into the cooling water return line 26.

German Patent Reference 10 2004 012978.9-34, the priority document corresponding to this invention, and its teachings are incorporated, by reference, into this specification.

What is claimed is:

1. A cooling device for a switchgear cabinet (10), having an air-conducting conduit (12) in which an air/water heat exchanger (14) is arranged and through which cooling air flows and to which a condensate collection container (16) for collecting accumulating condensate (18) is assigned, the cooling device comprising:

an external cooling device (22) connected to the air/water heat exchanger (14) via a cooling water feed line (24) for supplying the air/water heat exchanger with cooled cooling water, and via a cooling water return line (26) for returning warmed cooling water to the external cooling device;

a fan for moving air over the air/water heat exchanger, wherein the cooling water from the cooling water feed line (24) flows through the air/water heat exchanger to absorb heat energy from the moving air, and into the cooling water return line (26);

a pump installation (20) removing condensate (18) from the condensate collection container (16), wherein the pump installation (20) is connected with the cooling water return line (26) and pumps the condensate (18) out of the condensate collection container (16) into the cooling water return line (26) to be joined with the returning warmed cooling water exiting the air/water heat exchanger; and a sensor device (28) arranged in the condensate collection container (16), wherein the sensor device (28) is connected with the pump installation (20) so that the pump installation (20) pumps the condensate (18) into the cooling water return line (26) when a predetermined level of condensate is reached.

2. The cooling device in accordance with claim 1, wherein the air/water heat exchanger (14) forms a closed cooling system with the external cooling device (22) to which collecting condensate (18) is fed.

3. The cooling device in accordance with claim 2, wherein the pump installation (20) is a submersible pump lowered into the condensate (18) in the condensate collection container (16).

4. The cooling device in accordance with claim 2, wherein the pump installation (20) is arranged outside of the condensate collection container (16) and is connected with it via a condensate-carrying line (30).

5. The cooling device in accordance with claim 4, wherein the pump installation (20) is arranged underneath the condensate collection container (16), and the condensate collection container (16) has an outlet opening (32) at a bottom to which the condensate-carrying line (30) is connected.

6. The cooling device in accordance with claim 1, wherein the air/water heat exchanger (14) forms a closed cooling system with an external cooling device (22) to which collecting condensate (18) is fed.

7. The cooling device in accordance with claim 1, wherein the pump installation (20) is a submersible pump lowered into the condensate (18) in the condensate collection container (16).

8. The cooling device in accordance with claim 1, wherein the pump installation (20) is arranged outside of the condensate collection container (16) and is connected with it via a condensate-carrying line (30).

9. The cooling device in accordance with claim 8, wherein the pump installation (20) is arranged underneath the condensate collection container (16), and the condensate collection container (16) has an outlet opening (32) at a bottom to which the condensate-carrying line (30) is connected.

10. The cooling device in accordance with claim 1, wherein the pump installation (20) includes a pump and a line (21) connected with the cooling water return line (26), and pumps the condensate (18) out of the condensate collection container (16) and into the cooling water return line (26) through the line (21).

11. A cooling device for a switchgear cabinet, comprising:

an air-conducting conduit in which an air/water heat exchanger is arranged and through which cooling air flows, the air/water heat exchanger at least partially disposed within the switchgear cabinet;

an cooling device disposed external of the switchgear cabinet;

a cooling water feed line connecting the cooling device to the air/water heat exchanger for supplying cooled cooling water into the air/water heat exchanger;

a fan for moving air over the air/water heat exchanger;

a cooling water return line connecting the air/water heat exchanger to the cooling device for returning warmed cooling water exiting the air/water heat exchanger to the cooling device;

a condensate collection container disposed within the switchgear cabinet and beneath the air/water heat exchanger for collecting accumulating condensate;

a pump installation removing condensate from the condensate collection container, and the pump installation is connected with the cooling water return line and pumps the condensate out of the condensate collection container into the cooling water return line and into the returning warmed cooling water from the air/water heat exchanger.

12. The cooling device in accordance with claim 11, wherein the air/water heat exchanger forms a closed cooling system with the external cooling device to which collecting condensate is fed.

13. The cooling device in accordance with claim 11, further comprising a sensor device arranged in the condensate collection container for determining a condensate level.

14. The cooling device in accordance with claim 13, wherein the pump installation is connected to the sensor device and the pump installation pumps the condensate when the sensor device senses a predetermined level of condensate.

15. The cooling device in accordance with claim 13, wherein the pump installation comprises a submersible pump lowered into the condensate (18) in the condensate collection container (16).

16. The cooling device in accordance with claim 13, wherein the pump installation is arranged outside of the condensate collection container and connected with the condensate collection container via a condensate-carrying line.

17. The cooling device in accordance with claim 16, wherein the pump installation is arranged underneath the condensate collection container, and the condensate collection container includes an outlet opening at a bottom to which the condensate-carrying line is connected.

18. The cooling device in accordance with claim 11, wherein the pump installation is connected with the condensate collection container via a condensate-carrying line.

19. The cooling device in accordance with claim 18, wherein the condensate collection container has an outlet opening at a bottom to which the condensate-carrying line is connected.

* * * * *